(12) United States Patent
Winkel et al.

(10) Patent No.: US 11,058,028 B2
(45) Date of Patent: Jul. 6, 2021

(54) TECHNOLOGIES FOR MANAGING HOT SPOTS IN A COMPUTE DEVICE

(71) Applicant: Intel Corporation, Santa Clara, CA (US)

(72) Inventors: Casey Winkel, Hillsboro, OR (US); Shaorong Zhou, Shanghai (CN); Lianchang Du, Kunshan (CN); Feng Qi, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/398,957

(22) Filed: Apr. 30, 2019

(65) Prior Publication Data

US 2019/0261536 A1    Aug. 22, 2019

(51) Int. Cl.
*H05K 7/20* (2006.01)

(52) U.S. Cl.
CPC ..... *H05K 7/20209* (2013.01); *H05K 7/20145* (2013.01); *H05K 7/20163* (2013.01); *H05K 7/20218* (2013.01); *H05K 7/20718* (2013.01); *H05K 7/20727* (2013.01); *H05K 7/20763* (2013.01); *H05K 7/20772* (2013.01)

(58) Field of Classification Search
None
See application file for complete search history.

(56) References Cited

U.S. PATENT DOCUMENTS

| 6,990,817 | B1 * | 1/2006 | Bhatia | F25B 9/04 62/259.2 |
|---|---|---|---|---|
| 7,263,836 | B2 * | 9/2007 | Gunawardana | E21B 47/011 62/5 |
| 7,751,188 | B1 * | 7/2010 | French | H05K 7/20736 165/104.33 |
| 9,417,013 | B2 * | 8/2016 | Rowe | F28D 15/00 |
| 9,485,887 | B1 * | 11/2016 | Eichelberg | H05K 7/1497 |
| 10,398,061 | B1 * | 8/2019 | Ross | H05K 7/20745 |
| 2017/0272033 | A1 * | 9/2017 | Rivaud | H03K 19/00369 |
| 2018/0192549 | A1 * | 7/2018 | Boegner | G05D 27/02 |
| 2019/0116694 | A1 * | 4/2019 | Lyon | H05K 7/20781 |

* cited by examiner

*Primary Examiner* — Courtney L Smith
(74) *Attorney, Agent, or Firm* — Compass IP Law, PC

(57) ABSTRACT

Technologies for managing hot spots in a compute device with use of a vortex tube are disclosed. Cold air from one or more vortex tubes can be routed to hot spots of one or more compute devices, providing effective spot cooling. This approach may allow for cooling of components that might otherwise be difficult to cool, such as components where would be difficult or impossible to cool with a heat sink. This approach may also be effective in cooling components that are downstream of a heat sink and would otherwise only be cooled by air that was already heated by the heat sink.

20 Claims, 10 Drawing Sheets

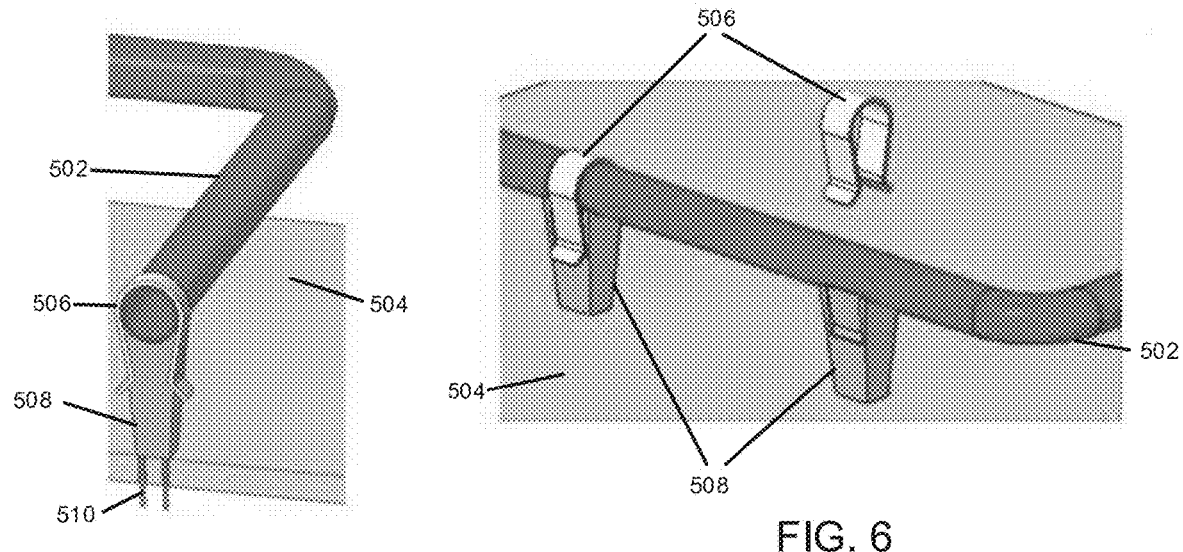
FIG. 5
FIG. 6
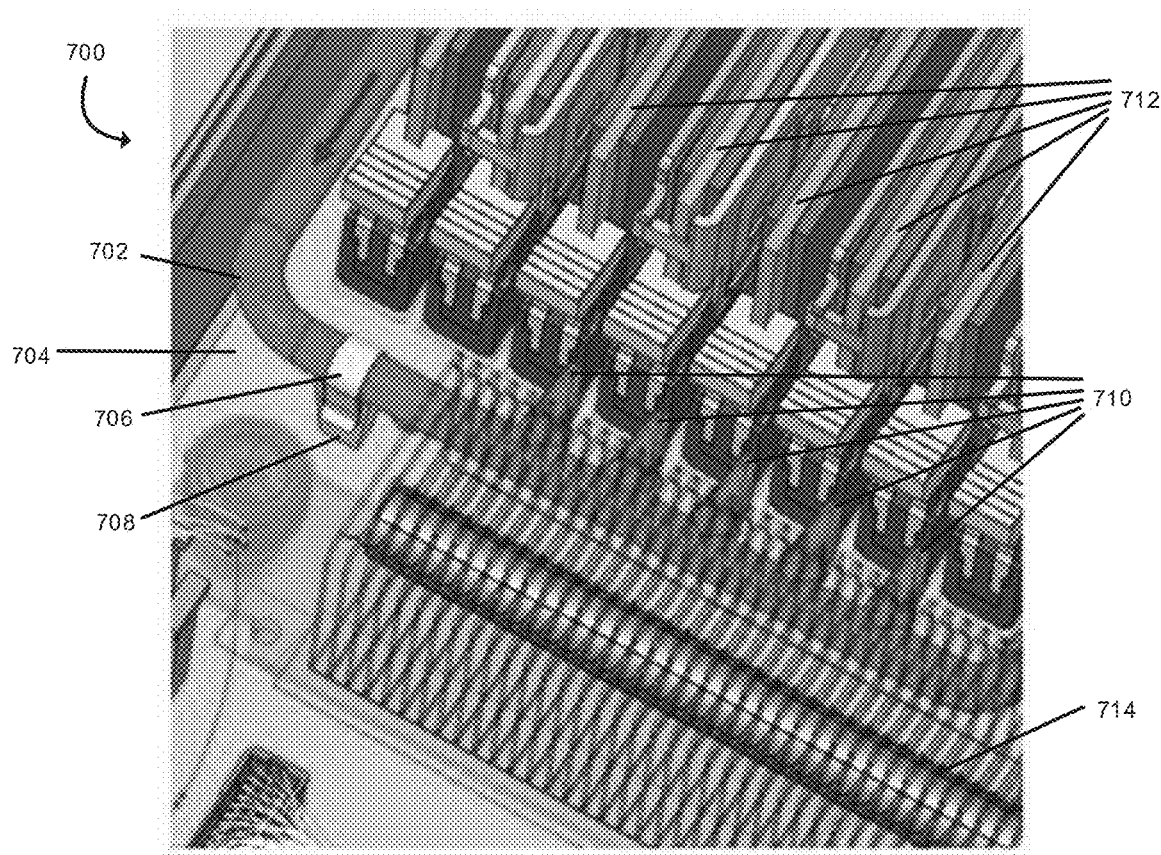
FIG. 7

TECHNOLOGIES FOR MANAGING HOT SPOTS IN A COMPUTE DEVICE

BACKGROUND

Compute devices often generate a significant amount of heat and require various forms of cooling. Fans and heat sinks are often used to cool down core components that generate a lot of heat such as processors. Some components such as memory may generate heat as well but may be physical configured so that use of a heat sink is impractical. Depending on the location of the heat sinks and the air flow parameters, some components may be downstream of heat sinks and, as a result, are only cooled by air that is heated by the heat sinks. In those instances, certain components may be susceptible to overheating.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

FIG. 5 is an illustration of at least one embodiment of a portion of the compute device of FIG. 3;

FIG. 6 is an illustration of at least one embodiment of a portion of the compute device of FIG. 3;

FIG. 7 is an illustration of at least one embodiment of a portion of the compute device of FIG. 3;

DETAILED DESCRIPTION OF THE DRAWINGS

Figure 1:
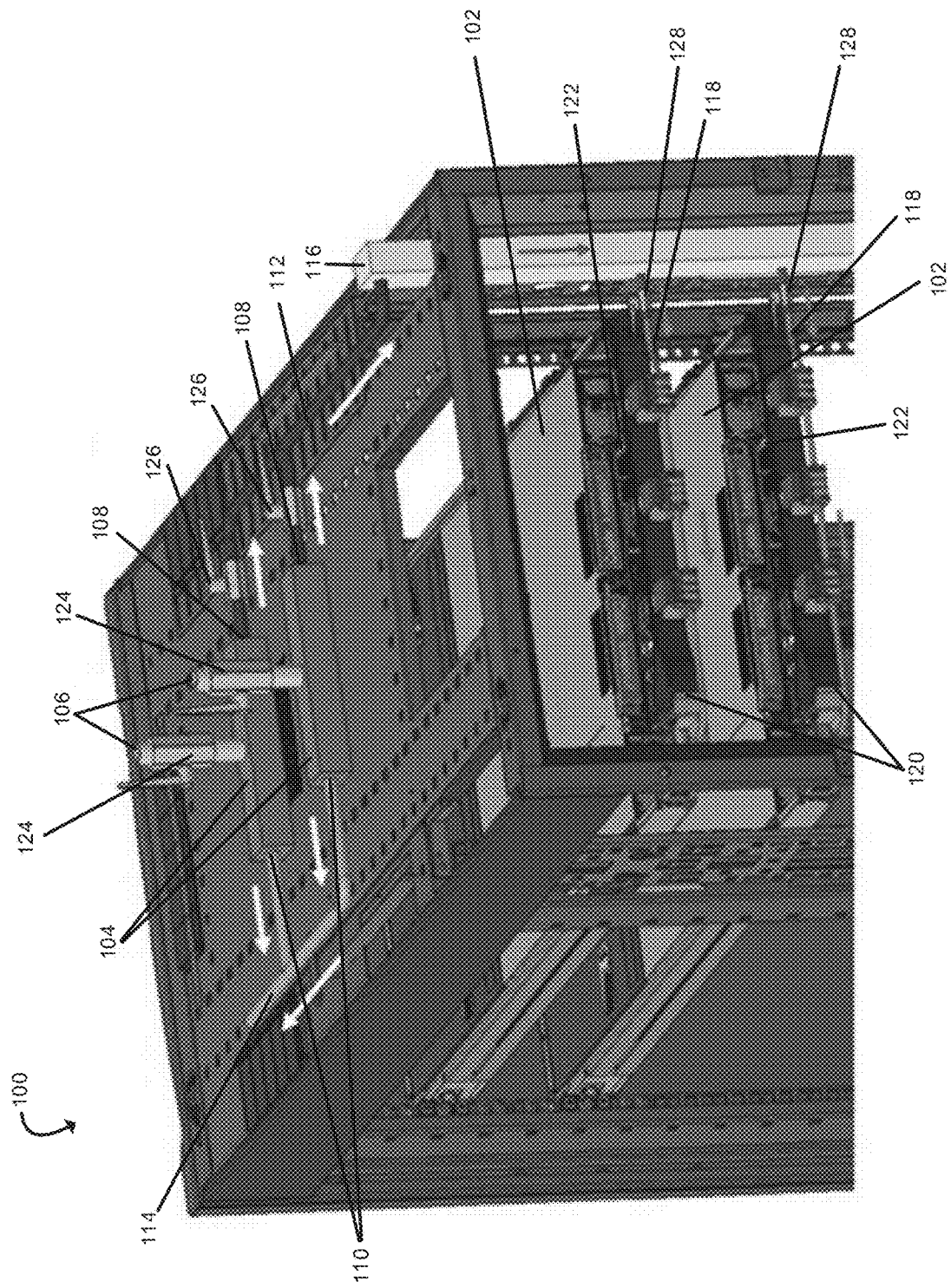
FIG. 1 is an illustration of at least one embodiment of a rack for one or more compute devices including a cooling system that encompasses a vortex tube.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, in the illustrative embodiment, a rack 100 includes several compute devices 102. The rack 100 includes one or more vortex tubes 104 that can provide a cold air stream from a source of compressed air, as discussed in more detail below in regard to FIG. 2. Each vortex tube 104 has an intake 106 for compressed air, a cold output 108, and a hot output 110. The cold output 108 is connected to a cold air tube 112 to be used for cooling hot spots in the compute devices 102. In some embodiments, the cold air tube 112 may be connected to more than one vortex tube 104, as shown in FIG. 1. In the illustrative embodiment, the source of compressed air may be an air compressor in a data center, such as an air compressor that is performing additional functionality unrelated to the vortex tubes 104. In some embodiments, air in an air compressor may be dried and/or filtered with one or more filters prior to being provided to the vortex tube 104.

The hot output 110 is, in the illustrative embodiment, connected to a hot air tube 112 to a hot aisle of a data center in which the rack 100 is located. Additionally or alternatively, in some embodiments, the hot air tube 114 may be directed towards, e.g., a ceiling of the data center, or there may not be a hot air tube 114, allowing the air from the hot output 110 to vent to the environment of a data center. Each of the cold air tube 112 and the hot air tube 114 may be any suitable type of tubing capable of carrying a stream of air, such as flexible plastic tubing. Each of the cold air tube 112 and the hot air tube 114 has an illustrative inner diameter of about 5 millimeters and an outer diameter of about 10 millimeters. Additionally or alternatively, in some embodiments, some or all of the cold air tube 112 and the hot air tube 114 may have any suitable inner diameter and wall thickness, such as an inner diameter of 1-10 millimeters or a wall thickness of 0.5-5 millimeters.

The cold air tube 114 carries cold air to a duct 116 to which the cold air tube 112 is connected. The duct 116 makes the cold air available to one or more compute devices 102 in the rack 100. The duct 116 may be made from any suitable material, such as plastic, metal, aluminum, etc. Each compute device 102 may have a tube 118 connected to the duct 116 to provide cold air to the compute device 102. The tube 118 may be routed through a cable management arm 120 to allow for servicing of the compute device 102 without disconnection of the tube 118. The tube 118 may be connected to an inlet connection 122 of the corresponding compute device 102. In some embodiments, there may not be an inlet connection 122, and the tube 118 may extend into from outside the compute device 102 into the compute device 102. Similar to the cold air tube 112 and the hot air tube 114, the tube 118 may be any suitable type of tubing capable of carrying a stream of air, such as flexible plastic tubing, and may have any suitable inner diameter and wall thickness, such as an inner diameter of 1-10 millimeters or a wall thickness of 0.5-5 millimeters. Like the cold air tube 112 and the hot air tube 114, the illustrative tube 118 has an inner diameter of about 5 millimeters and an outer diameter of about 10 millimeters The cooling system composed of the vortex tubes 104, the tubes 112, 114, and 118, and the duct 116 may include one or more valves, such as an intake valve 124 at each vortex tube 104, a cold air output valve 126, and a duct line valve 128. The various valves 124, 126, and 128 may be adjusted to control air flow, temperature, pressure, etc. The valves 124, 126, and 128, may be any suitable type of valve, such as a ball valve, a butterfly valve, a check valve, a solenoid valve, or a pressure regulator. In some embodiments, the various valves 124, 126, and 128 may be controlled by a compute device, such as the management server 1100 discussed below in regard to FIG. 11. The management server 1100 may control the various valves 124, 126, and 128 to control the amount of and temperature of cool air delivered to the compute devices 102, as discussed in more detail below in regard to FIGS. 11-13. The duct line valves 128 may be shut when there is no compute device 102 in the corresponding bay of the rack 100.

The compute device 102 may be any compute device that can benefit from spot cooling. In the illustrative embodiment, the compute device 102 is a blade or sled in a rack 100. In other embodiments, the compute device 102 may be a disaggregated computing system such as a compute sled, a storage sled, or a memory sled in a rack scale architecture system, an embedded computing system, a System-on-a-Chip (SoC), a server computer, a desktop computer, etc.

The rack 100 may be any structure that can have one or more vortex tubes 104 mounted on or near the rack 100 and is configured to mate with one or more compute devices. For example, the rack 100 may be a sever rack enclosure, an open frame rack, a transportable rack, a rack constructed from two or more posts, a wall mount rack, etc. The rack 100 may be configured to receive one or more sleds, blades, servers, etc. In the illustrative embodiment, one or more vortex tubes 104 are secured to the top of the rack, such as by a clip, fastener, mount, and/or the like. Additionally alternatively, one or more vortex tubes 104 may be disposed in other locations, such as on a side of the rack 100, on the back of the rack 100, or near the rack 100 without being directly secured to the rack 100.

Figure 2:
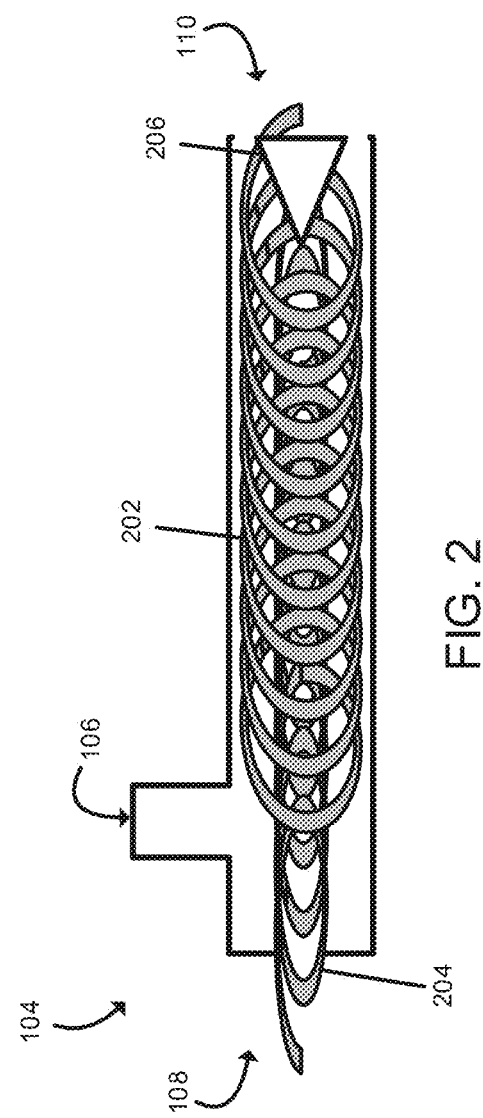
FIG. 2 is a simplified block diagram of a vortex tube that may be used as part of a cooling system of the rack of FIG. 1.

Referring now to FIG. 2, a simplified sketch of a vortex tube 104 includes the intake 106 for compressed air, a cold output 108, and a hot output 110. As the compressed air enters through the intake 106, it is directed tangentially into the vortex tube 104, and spins around the outside edge of the vortex tube 104, creating an outer vortex 202. The air in the outer vortex 202 moves towards a conical nozzle 206 at the hot output 110. The gas at the periphery of the outer vortex 202 is allowed to escape through the conical nozzle 206, but the rest of the gas is directed back towards the cold output 108 as an inner vortex 204. Although the temperature of the outer vortex 202 and the inner vortex 204 are approximately the same along the length of the vortex tube 104, the inner vortex 204 is rotating more slowly than the outer vortex 202, so the inner vortex 204 has less kinetic energy that can be converted to heat. Additionally, there is a heat recuperation effect between the outer vortex 202 and the inner vortex 204. The overall effect of the vortex tube 104 is that hot air comes out of the hot output 110 and cold air comes out of the cold output 108.

The exact temperatures vary with the pressure at the intake 106, the fraction of the air that exits at the hot output 110 and the cold output 108, and the design of the vortex tube 104. In some embodiments, the temperature change can be large. For example, in some embodiments, the air at the cold output 108 may be up to 50° Celsius cooler than the temperature of the air at the intake 106. In the illustrative embodiment, the temperature of the air at the cold output 108 may be a smaller decrease in order to prevent condensation on components of the compute device 102. For example, in the illustrative embodiment, the air may be cooled to about 10° Celsius. In some embodiments, the temperature of the air that is blown on components of the compute device 102 may be, e.g., anywhere in the range of 0-20° Celsius. It should be appreciated that the temperature of the air may increase from the cold output 108 to the location where the air is blown on components of the compute device 102. In some embodiments, the conical nozzle 206 may be adjustable, either manually or by computer control, which allows for additional control of the flow rate and temperature of the air at the cold output 108.

In the illustrative embodiment, the total flow rate of the vortex tubes 104 on the rack 100 is about one standard cubic foot per minute (SCFM). Of course, the flow rate may vary on the number of compute devices 102 in the rack 100, the number of components that are being cooled in the compute devices 102, ambient conditions such as temperature and humidity, etc. For example, in some embodiments, the flow rate of the vortex tubes 104 on the rack 100 may be anywhere from 0.1-50 SCFM and the flow rate of the vortex tubes 104 on the rack 100 may be anywhere from 0.1-10 SCFM per compute device 102 in the rack 100. The pressure at the intake 106 may be any suitable pressure and may depend on what air compressor is available at a particular datacenter, such as 1-10 bars above atmospheric pressure. The illustrative pressure at the intake 106 is about 7 bars about atmospheric pressure. The back pressure on the cold output 108 may be any suitable pressure, such as 0.1 to 0.5 bars.

The vortex tube 104 may be made of any suitable material, such as metal or plastic. In the illustrative embodiment, the vortex tube 104 is made of metal, such as aluminum or steel.

Figure 3:
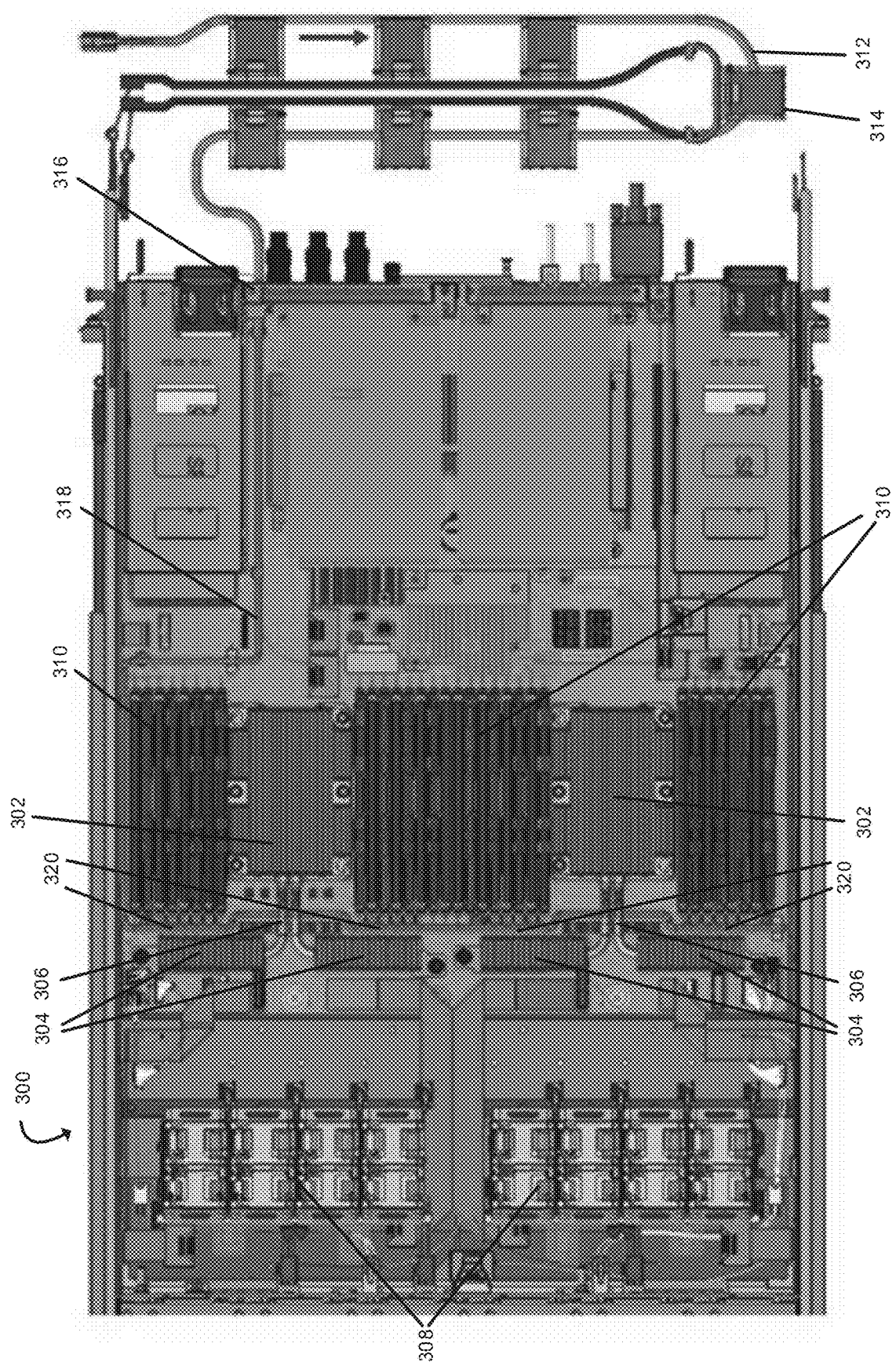
FIG. 3 is an illustration of at least one embodiment of a compute device of the system of FIG. 1 that may be cooled with use of the vortex tube of FIG. 2.

Referring now to FIG. 3, one embodiment of a compute device 300 that may be placed in the rack 100 is shown. As discussed above, the compute device 300 may be any compute device that can benefit from spot cooling, such as a blade or sled in a rack 100. The illustrative compute device 300 includes one or more processors with heat sinks 302. Each heat sink 302 may be connected to one or more auxiliary heat sinks 304 through one or more heat pipes 306 to allow for additional cooling. Cooling of the heat sinks 302, 304 is facilitated by one or more fans 308 to provide air flow over the heat sinks 302, 304.

The compute device 300 may include one or more memory banks 310, which may include one or more memory modules such as dual in-line memory modules (DIMMs). The memory modules in the memory banks 310 may have a close pitch (i.e., may be close together) such as 0.31 inches and may be difficult to cool with traditional fan and/or heat sink cooling.

The compute device 300 may also contain one or more fans 308. The fans 308 are configured to draw air in the front of the compute device 300 (i.e., the left side of FIG. 3), which may be facing a cold aisle of a data center, and blow air over the various components of the compute device 300, including the heat sinks 302, 304. The air that has now been warmed up as a result of cooling various components of the compute device 300 may exit an exhaust on the back of the compute device 300 (i.e., the right side of FIG. 3), which may be facing a hot aisle of a data center. It should be appreciated that, as shown in FIG. 3, the heat sinks 302, 304 may be between the memory banks 310 and the fans 308, preheating the air that flows over the memory banks 310, further reducing the effectiveness of the fans 308 in cooling the memory banks 310.

The compute device 300 has a tube 312 carrying cold air from a vortex tube 104 (not shown). The tube 312 is routed through a cable management arm 314 and connected to an inlet connection 316 of the compute device 300. The compute device 300 has a tube 318 that is connected to an internal connection of the inlet connection 316, allowing for the cold air to be routed to various components of the compute device 300. The tubes 312, 318 may be similar to the tubes 112, 114, and 118 of FIG. 1, the description of which will not be repeated in the interest of clarity.

In the illustrative embodiment, the tube 318 is connected to several nozzle banks 320. Each nozzle bank 320 has several nozzles that provide cool air to the memory modules in the memory banks 310, as described in more detail in regard to FIG. 4.

Figure 4:
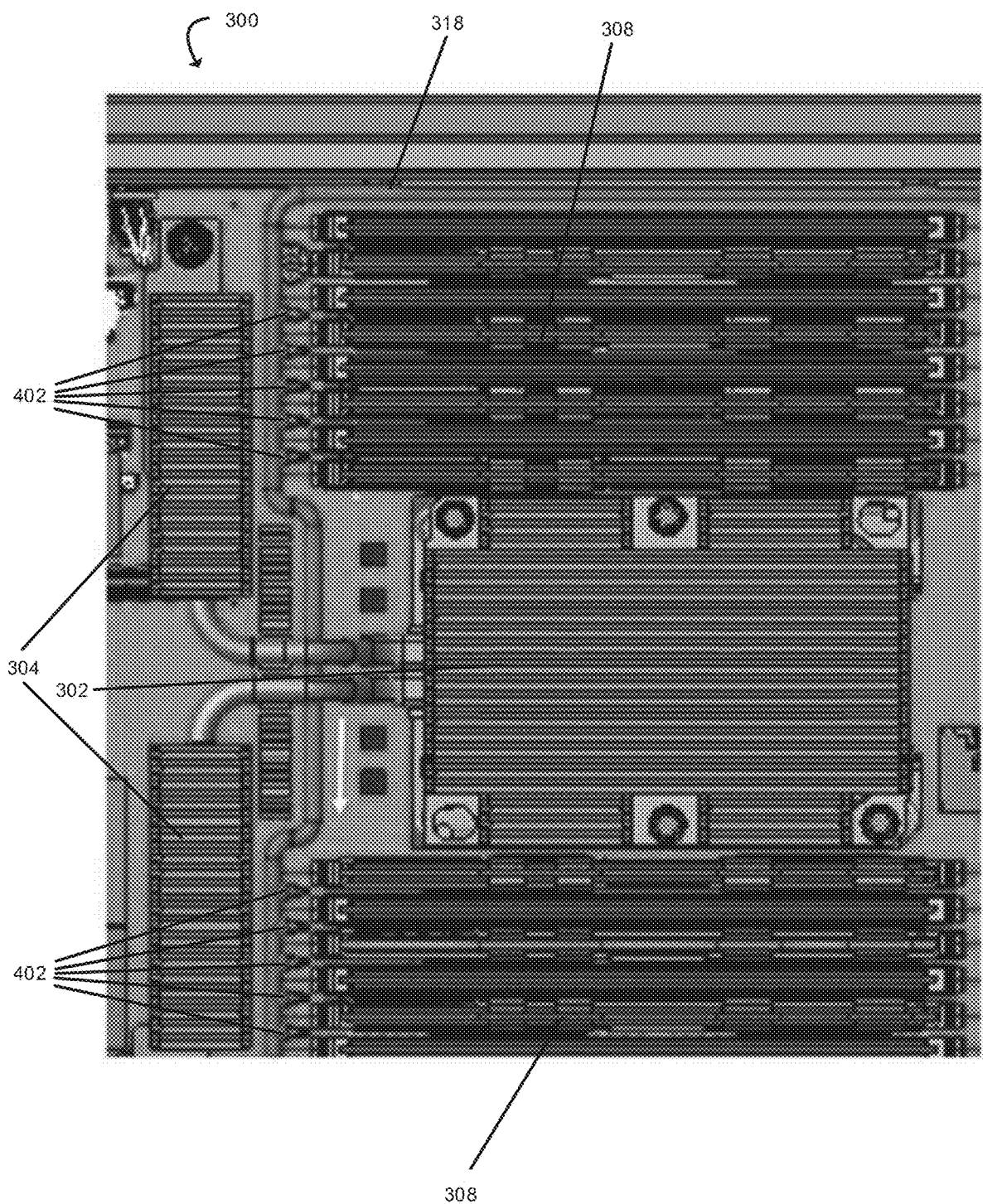
FIG. 4 is an illustration of at least one embodiment of a portion of the compute device of FIG. 3.

Referring now to FIG. 4, a magnified view of a portion of the compute device 300 shows a more detailed view of the nozzle banks 320, which include one or more nozzles 402. As shown, each nozzle 402 is directed in between two of the memory modules of the memory bank 310, providing effective cooling of the memory modules. Of course, a nozzle 402 may be directed to one side of a memory module at the end of the memory bank 310 that does not have another memory module opposite it. Additionally or alternatively, the nozzles 402 may be directed to memory components other than those in a DIMM form factor. More generally, nozzles 402 may be placed to direct cool air towards any suitable location, including locations with small gaps where traditional fan and/or heat sink cooling may be impractical, such as for components with air gaps of less than 0.1-1 inches. Such components may include PCIe cards, artificial intelligence cards, etc.

Referring now to FIGS. 5 and 6, tube 502 may be secured to a circuit board 504 with use of one or more clips 506 and spacers 508. The spacers 508 may have one or more pins 510 through the circuit board 504 to secure it. The pins 510 may be secured to the circuit board 504 in any suitable manner, such as by being soldered to the board 504 or being bent. The circuit board 504 may be, e.g., a parent board for the compute device 102 or 300. A similar approach to the clips 506 and spacers 508 may be used to secure tubes in places other than on a circuit board, such as the tubes 112 and 114 on top of the rack 100. FIG. 5 shows a cross-section view of a tube 502, clip 506, spacer 508, and circuit board 504, showing the pins 510 going through the circuit board 504. FIG. 6 shows an example embodiment of a clip 506 that is joined to a spacer 508 to secure the tube 502 and of a clip 506 that is not yet joined to a spacer 508.

Referring now to FIG. 7, a compute device 700 similar to the compute device 300 may include a tube 702 carrying cold air that is secured to a circuit board 704 with a clip 706 and spacer 708. The tube 702 may be connected to several nozzles 710 that are directed to spaces between to spaces between memory modules 712. As shown above in FIG. 3, the memory modules 712 may be positioned further downstream from a fan than a heat sink 714, which would reduce the cooling ability of air flowing between the memory modules 712 in the absence of the nozzles 710 providing cool air.

Figure 8:
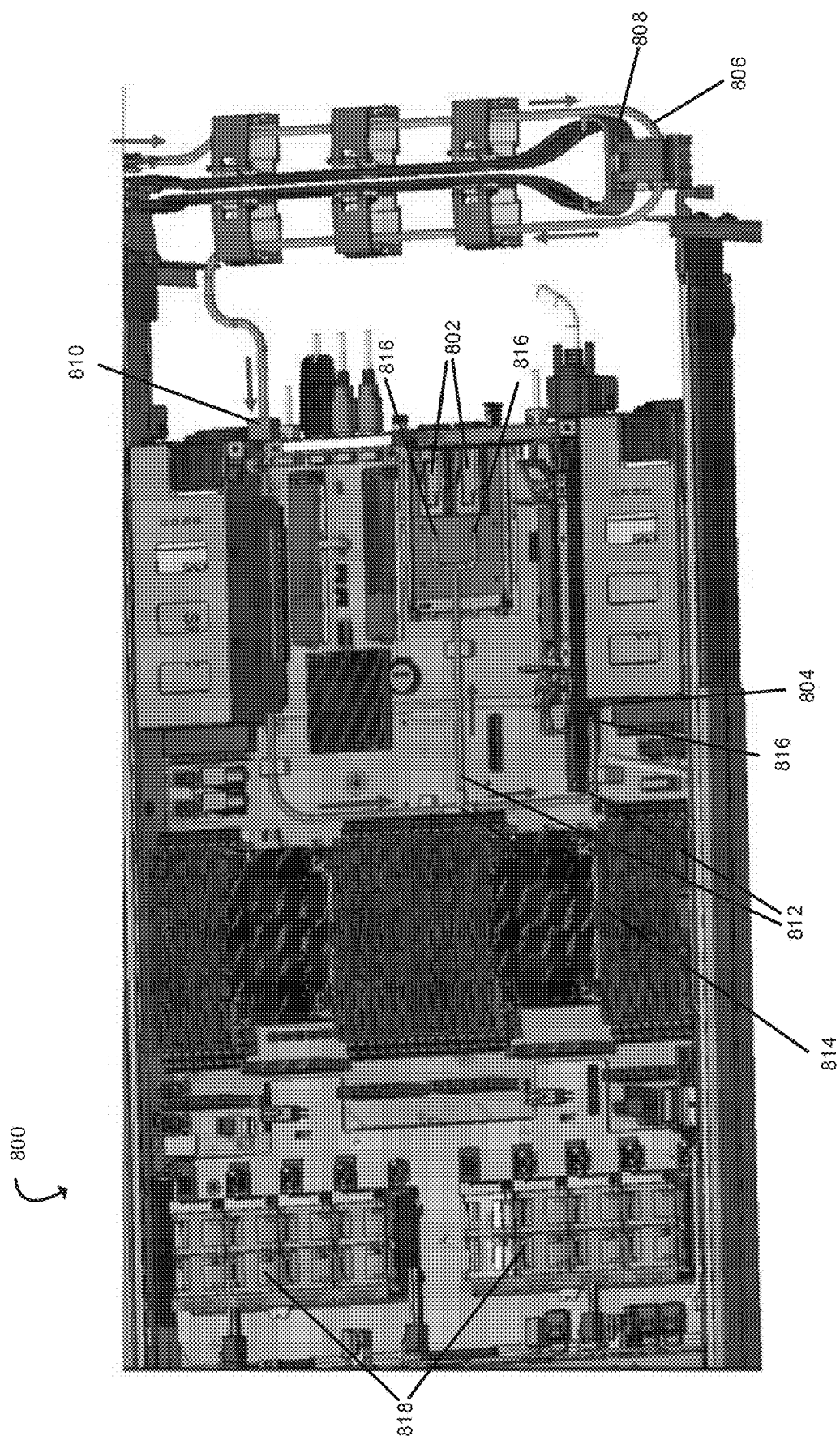
FIG. 8 is an illustration of at least one embodiment of a compute device of the system of FIG. 1 that may be cooled with use of the vortex tube of FIG. 2.

It should be appreciated that the embodiments of the concepts disclosed herein are not limited to providing cooling for memory components. For example, referring now to FIG. 8, another embodiment of a compute device 800 may have one or more transceivers 802 and/or one or more retimer circuits 804 that require a small amount of cooling. The transceivers 802 may be embodied as any type of transceiver, such as an enhanced small form-factor pluggable (SFP+) transceiver.

The compute device 800 may include a tube 806 from a vortex tube 104 running through a cable management arm 808 that is connected to an inlet connection 810 of the compute device 800. A tube 812 may be connected to an interior side of the inlet connection 810. The tube 812 may branch into two or more branches with one or more splitters 814. The tube 812 may have one or more nozzles 816 to cool the transceivers 802 and/or retimer circuits 804. It should be appreciated that, as discussed above in regard to FIG. 3, the compute device 800 may include one or more fans 818, but the air from those fans 818 may be preheated by the presence of one or more heat sinks 820, providing insufficient cooling for the transceivers 802 and/or retimer circuits 804.

Figure 9:
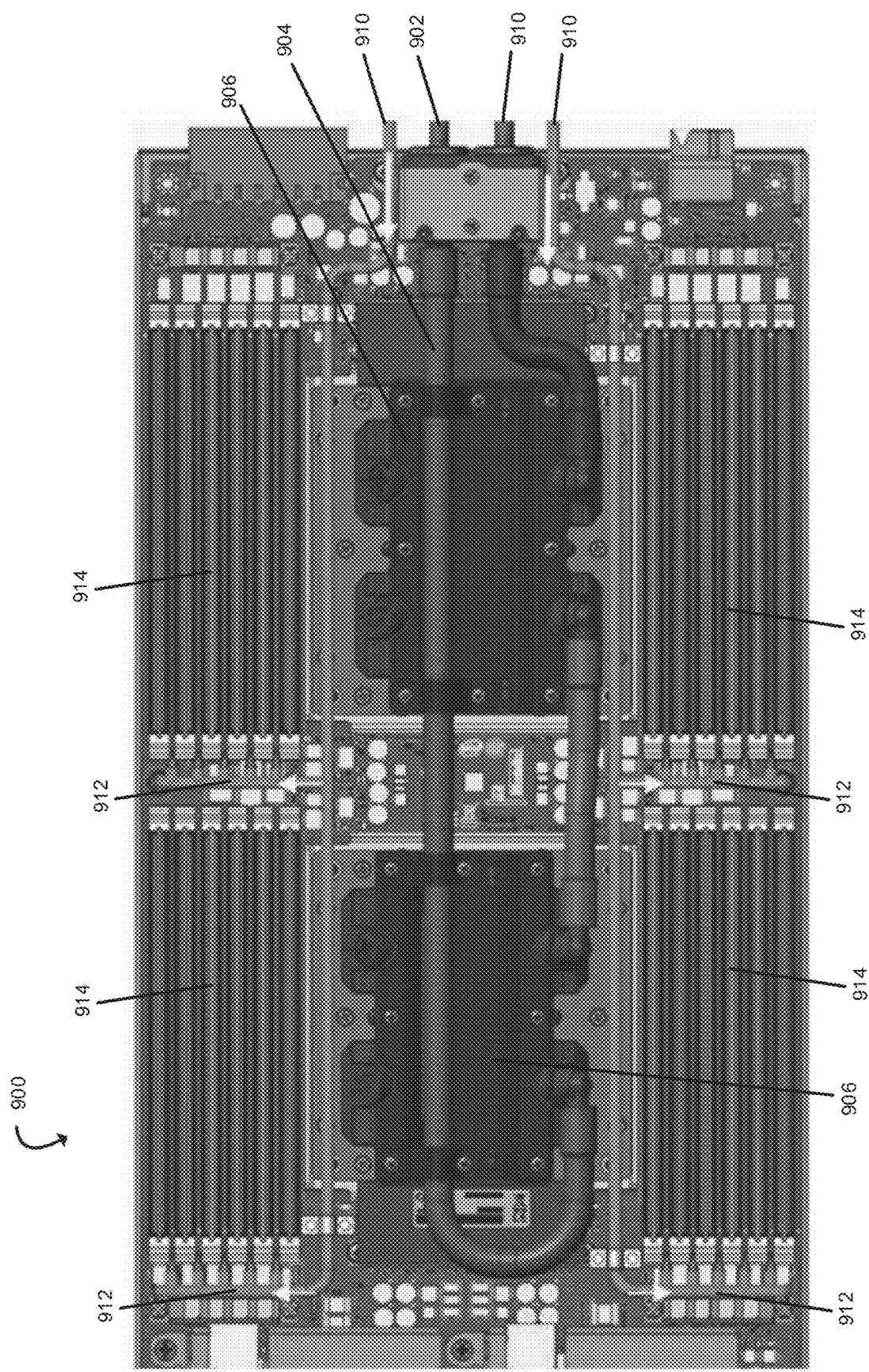
FIG. 9 is an illustration of at least one embodiment of a compute device of the system of FIG. 1 that may be cooled with use of the vortex tube of FIG. 2.

Referring now to FIG. 9, in another embodiments, the cooling techniques disclosed herein may be used together with a liquid cooling system. A compute device 900 may include a liquid cooling intake 902 that is connected to, e.g., a source of water that may be chilled or cooled to a temperature lower than the components of the compute device 900 to be cooled. A tube 904 may be connected to the liquid cooling intake 902 to carry the liquid to one or more heat sinks 906 that may be cooling, e.g., one or more processors. The tube 904 then carries the heating liquid to a liquid cooling outlet 908.

The compute device 900 may include one or more tubes 910 connected to one or more vortex tubes 104 (not shown).

The tubes 910 may be connected to one or more nozzle banks 912 to provide cooling to one or more memory banks 914, similar to FIG. 3 discussed above.

The compute device 900 with a liquid-cooling system may be any compute device that can benefit from both liquid cooling and spot air cooling. The compute device 900 may be a blade or sled in a rack 100, a disaggregated computing system such as a compute sled, a storage sled, or a memory sled in a rack scale architecture system, an embedded computing system, a System-on-a-Chip (SoC), a server computer, a desktop computer, etc. It should be appreciated that, in some embodiments, the compute device 900 may not have a fan blowing air directly onto the components of the compute device 102, and the vortex tube 104 may provide the only source of active air cooling in the compute device 900.

Figure 10:
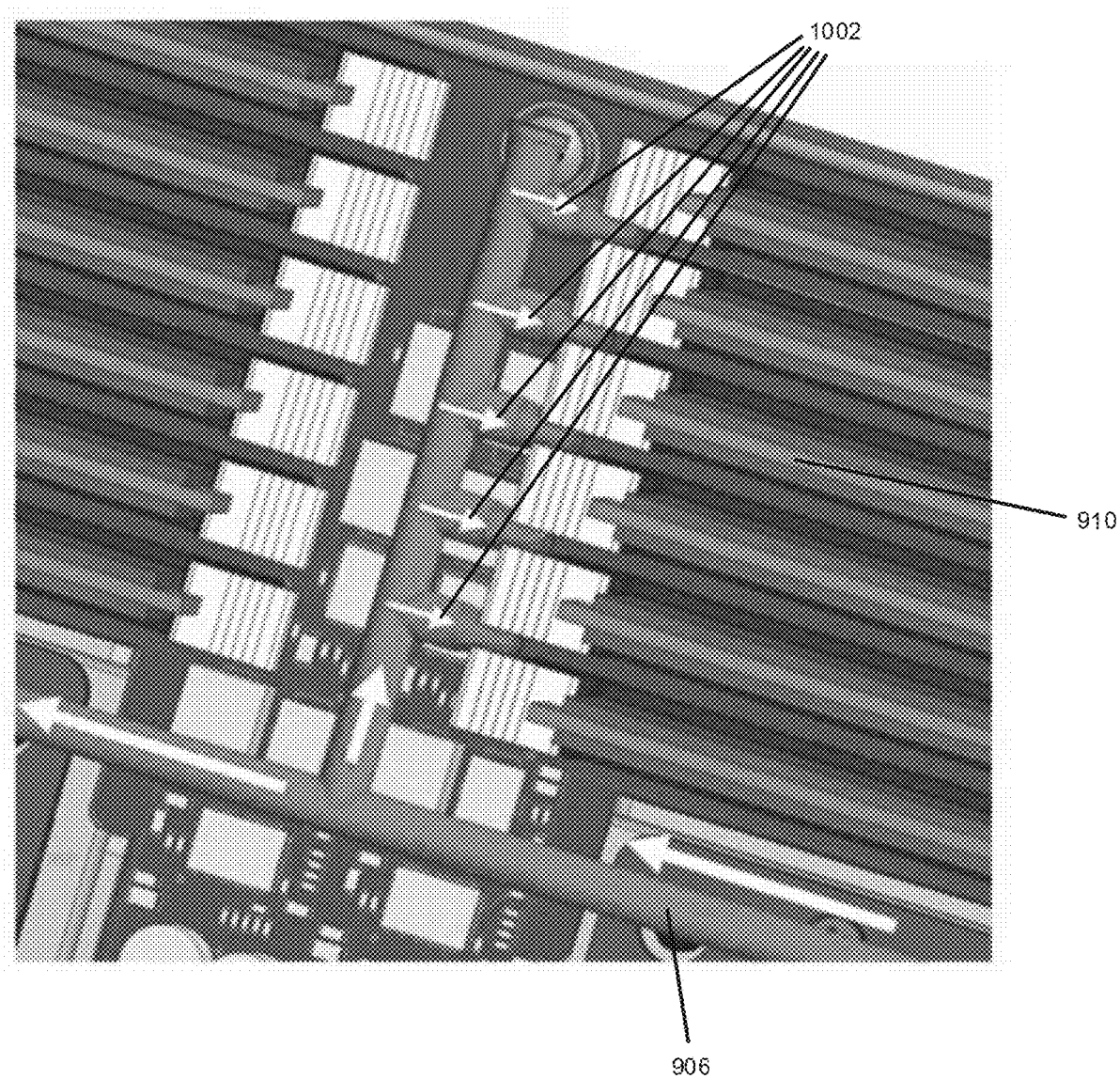
FIG. 10 is an illustration of at least one embodiment of a portion of the compute device of FIG. 9.

Referring now to FIG. 10, a magnified view of a portion of the compute device 900 shows a more detailed view of one nozzle bank 912, which includes one or more nozzles 1002. As shown, each nozzle 1002 is directed in between two of the memory modules of the memory bank 914, providing effective cooling of the memory modules.

Figure 11:
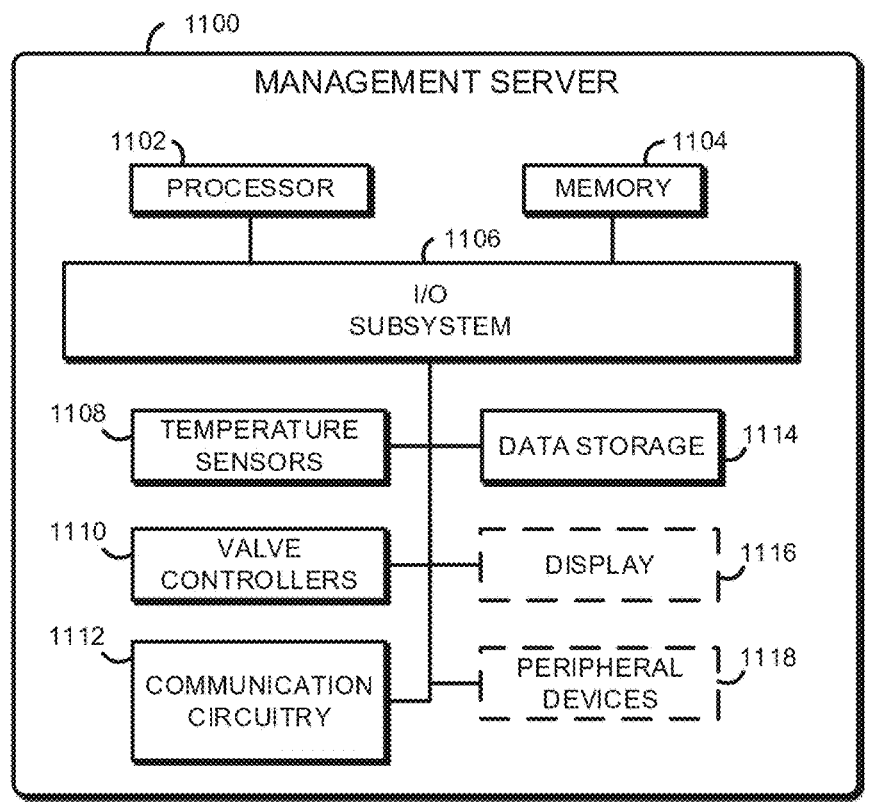
FIG. 11 is a simplified block diagram of at least one compute device that may be used to control aspects of a cooling system that may include the vortex tube of FIG. 2.
Figure 12:
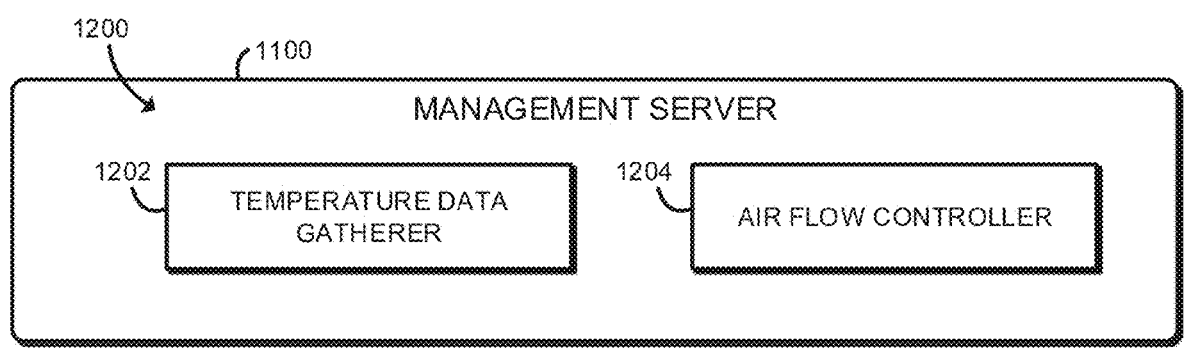
FIG. 12 is a block diagram of at least one embodiment of an environment that may be established by the compute device of FIG. 11.

Referring now to FIG. 11, a management server 1100 for controlling the air flow of one or more vortex tubes 104 may be embodied as any type of compute device capable of performing the functions described herein. For example, the management server 1100 may be embodied as or otherwise be included in, without limitation, a server computer, a desktop computer, a sled or blade of a rack, a disaggregated computing system such as a rack scale architecture system, a smartphone, a cellular phone, a wearable computer, an embedded computing system, a System-on-a-Chip (SoC), a tablet computer, a notebook computer, a laptop computer, a handset, a messaging device, a camera device, a multiprocessor system, a processor-based system, a consumer electronic device, and/or any other computing device. In some embodiments, the management server 1100 may be embodied as a management or orchestration server of a data center that includes one or more of the compute device 102, compute device 300, compute device 700, compute device 800, or compute device 900. Additionally or alternatively, in some embodiments, the management server 1100 may be embodied as one or more of the compute device 102, compute device 300, compute device 700, compute device 800, or compute device 900.

The illustrative management server 1100 includes a processor 1102, a memory 1104, an input/output (I/O) subsystem 1106, one or more temperature sensors 1108, one or more valve controllers 1110, communication circuitry 1112, and data storage 1114. In some embodiments, one or more of the illustrative components of the management server 1100 may be incorporated in, or otherwise form a portion of, another component. For example, the memory 1104, or portions thereof, may be incorporated in the processor 1102 in some embodiments.

The processor 1102 may be embodied as any type of processor capable of performing the functions described herein. For example, the processor 1102 may be embodied as a single or multi-core processor(s), a single or multi-socket processor, a digital signal processor, a microcontroller, or other processor or processing/controlling circuit.

Similarly, the memory 1104 may be embodied as any type of volatile or non-volatile memory or data storage capable of performing the functions described herein. In operation, the memory 1104 may store various data and software used during operation of the management server 1100 such as operating systems, applications, programs, libraries, and drivers. The memory 1104 is communicatively coupled to the processor 1102 via the I/O subsystem 1106, which may be embodied as circuitry and/or components to facilitate input/output operations with the processor 1102, the memory 1104, and other components of the management server 1100. For example, the I/O subsystem 1106 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem 1106 may form a portion of a system-on-a-chip (SoC) and be incorporated, along with the processor 1102, the memory 1104, and other components of the management server 1100 on a single integrated circuit chip.

The temperature sensors 1108 are configured to measure one or more temperatures related to the cooling system based on the vortex tubes 104. The temperature sensors 1108 may measure, e.g., the temperature of compressed air going into the intake 106 of the vortex tube 104, the temperature of air going out of the cold output 108 or hot output 110, the temperature of air coming out of one or more nozzles 402, 710, 816, or 1002, the temperature of one or more components of the compute device to be cooled, etc. The temperature sensors 1108 may be any suitable kind of temperature sensor, such as a thermistor, thermocouple, or semiconductor-based sensor. In some embodiments, some or all of the temperature sensors 1108 may be incorporated into other components of a compute device, such as a memory module 712, a transceiver 802, a retimer circuit 804, etc. It should be appreciated that, in some embodiments, the management server 1100 may not incorporate any temperature sensor that measures a temperature related to the cooling system based on the vortex tubes 104, but, rather, the management server 1100 may receive temperature data from a remote compute device that measures the temperatures identified above directly.

The valve controllers 1110 are configured to control one or more valves, such as the intake valve 124, the cold air output valve 126, the duct line valve 128, the conical nozzle 206, and/or the like. The valve controllers 1110 may be able to toggle some valves between a fully open and fully close state. Additionally or alternatively, the valve controllers 1110 may be able to control some valves to be in a wider range of states, such as a continuum of states between fully open and fully closed. In some embodiments, such as when one or more of the valves is embodied as a pressure regulator, the valve controllers 1110 may be able to set a particular pressure at the input or output of one or more of the valves.

The communication circuitry 1112 may be embodied as any type of interface capable of interfacing the management server 1100 with another compute device or a network. The communication circuitry 1112 may also be referred to or be embodied as a network interface controller (NIC). The communication circuitry 1112 may be capable of interfacing with any appropriate cable type, such as an electrical cable or an optical cable. The communication circuitry 1112 may be configured to use any one or more communication technology and associated protocols (e.g., Ethernet, Bluetooth®, Wi-Fi®, WiMAX, near field communication (NFC), Omni-Path, etc.). Furthermore, in some embodiments, the communication circuitry 1112 may be in a package separate from the processor 1102, in a multi-chip package with the processor 1102, or in a system-on-a-chip with the processor 1102.

The data storage 1114 may be embodied as any type of device or devices configured for the short-term or long-term storage of data. For example, the data storage 1114 may include any one or more memory devices and circuits, memory cards, hard disk drives, solid-state drives, or other data storage devices.

Of course, in some embodiments, the management server 1100 may include additional components often found in a management server 1100, such as a display 1116 or one or more peripheral devices 1118. The display may be embodied as any type of display on which information may be displayed to a user of the management server 1100, such as a liquid crystal display (LCD), a light emitting diode (LED) display, a cathode ray tube (CRT) display, a plasma display, an image projector (e.g., 2D or 3D), a laser projector, a touchscreen display, a heads-up display, and/or other display technology. The peripheral devices 1118 may include a keyboard, a mouse, a camera, etc.

Figure 13:
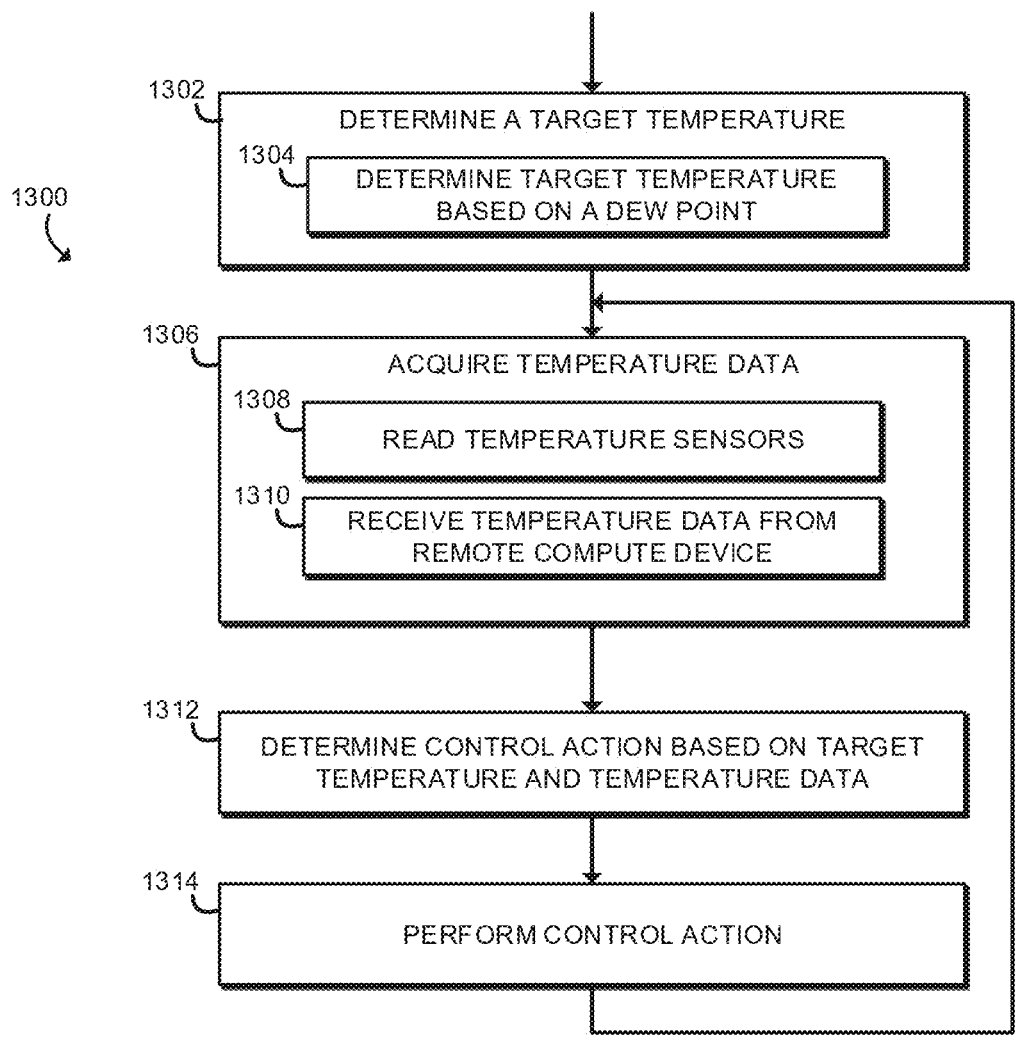
FIG. 13 is a simplified flow diagram of at least one embodiment of a method for controlling a cooling system that may include the vortex tube of FIG. 2.

Referring now to FIG. 13, in an illustrative embodiment, the management server 1100 establishes an environment 1200 during operation. The illustrative environment 1200 includes a temperature data gatherer 1202 and an air flow controller 1204. The various components of the environment 1200 may be embodied as hardware, software, firmware, or a combination thereof. For example, the various components of the environment 1200 may form a portion of, or otherwise be established by, the processor 1102, the memory 1104, or other hardware components of the management server 1100. As such, in some embodiments, one or more of the components of the environment 1200 may be embodied as circuitry or collection of electrical devices (e.g., temperature data gatherer circuitry 1202, air flow controller circuitry 1204, etc.). It should be appreciated that, in such embodiments, one or more of the circuits (e.g., the temperature data gatherer circuitry 1202, air flow controller circuitry 1204, etc.) may form a portion of one or more of the processor 1102, the memory 1104, the I/O subsystem 1106, the communication circuitry 1112, the data storage 1114, an application specific integrated circuit (ASIC), a programmable circuit such as a field-programmable gate array (FPGA), and/or other components of the management server 1100. For example, the air flow controller circuitry 1204 may be embodied as the processor 1102 and associated instructions stored on the data storage 1114 and/or the memory 1104 that may be executed by the processor 1102. Additionally, in some embodiments, one or more of the illustrative components may form a portion of another component and/or one or more of the illustrative components may be independent of one another. Further, in some embodiments, one or more of the components of the environment 1200 may be embodied as virtualized hardware components or emulated architecture, which may be established and maintained by the processor 1102 or other components of the management server 1100. It should be appreciated that some of the functionality of one or more of the components of the environment 1200 may require a hardware implementation, in which case embodiments of components which implement such functionality will be embodied at least partially as hardware.

The temperature data gatherer 1202, which may be embodied as hardware (e.g., circuitry), firmware, software, virtualized hardware, emulated architecture, and/or a combination thereof as discussed above, is configured to gather temperature data of one or more temperatures associated with a cooling system that incorporates a vortex tube 104. In the illustrative embodiment, the temperature data gatherer 1202 reads temperature data from the one or more temperature sensors 1108 to measure, e.g., the temperature of compressed air going into the intake 106 of the vortex tube 104, the temperature of air going out of the cold output 108 or hot output 110, the temperature of air coming out of one or more nozzles 402, 710, 816, or 1002, the temperature of one or more components of the compute device to be cooled, etc. Additionally or alternatively, the temperature data gatherer 1202 may receive temperature sensor data from other compute devices or from other components of the compute device 1200. For example, the compute device 300 may monitor the temperature of the memory modules 712 and may send temperature data of the memory modules 712 to the compute device 1200.

The air flow controller 1204, which may be embodied as hardware (e.g., circuitry), firmware, software, virtualized hardware, emulated architecture, and/or a combination thereof as discussed above, is configured to control the air flow of one or more vortex tubes 104. The air flow controller 1204 may control the air flow of the vortex tubes 104 by controlling one or more valves with the valve controllers 1110, such as the intake valve 124, the cold air output valve 126, the duct line valve 128, the conical nozzle 206, and/or the like. The air flow controller 1204 may be configured to provide a certain amount of cooling power to the various tubes of the various embodiments of the cooling systems described herein. In some embodiments, the air flow controller 1204 may be configured to provide a fixed amount of cooling to a given component based on, e.g., anticipated heat load. Additionally or alternatively, the air flow controller 1204 may control an air flow based on the temperature data gathered by the temperature data gatherer 1202. For example, in some embodiments, a target temperature may be determined for a particular spot, such as the temperature of the air at the cold output 108 and/or the temperature of component of a compute device, and the air flow controller 1204 may control the air flow to that component based on a measured temperature at that particular spot. In some embodiments, the target temperature may be chosen based on a dew point of the environment in order to prevent condensation. For example, the temperature of the air at the cold output 108 might be set at a target temperature that is at or, e.g., 0-10° Celsius above the dew point of the environment. The air flow controller 1204 may use any suitable control algorithm, such as a proportional-integral-derivative (PID) controller or a bang-bang controller. In some embodiments, the air flow controller 1204 may be integrated into a fan controller that controls, e.g., the fans 308 of the compute device 300. In such embodiments, the control of the fans 308 may be coordinated with the control of the air flow of the vortex tubes 104. For example, if the heat sinks 302, 304 require less cooling, the fans 308 can be slowed down, and the air flow from the vortex tubes 104 can be increased to compensate for any reduced cooling to the memory banks 310.

Referring now to FIG. 13, in use, the management server 1100 may execute a method 1300 for controlling air flow of a vortex tube 104. The method 1300 begins in block 1302, in which the compute device 102 determines a target temperature. The target temperature may be a target temperature measured at any one or more of the temperature sensors 1108, such as a target for the temperature of compressed air going into the intake 106 of the vortex tube 104, the temperature of air going out of the cold output 108 or hot output 110, the temperature of air coming out of one or more nozzles 402, 710, 816, or 1002, the temperature of one or more components of the compute device to be cooled, etc. The target temperature may be determined in any suitable manner, such as by a manual setting, an automatic setting, based on a specification of the component to be cooled, etc. In some embodiments, in block 1304, the management server 1100 determines a target temperature based on a dew point of the environment where the cooled air will be blown. For example, the temperature of the air at the cold output 108 might be set at a target temperature that is at or, e.g., 0-10° Celsius above the dew point of the environment In block 1306, the management server 1100 acquires temperature data. In the illustrative embodiment, the management server 1100 acquires temperature data by reading the temperature sensors 1108 in block 1308. Additionally or alternatively, in some embodiments, the management server 1100 may acquire temperature data by receiving temperature data from a remote compute device that measures the reads temperature sensors in block 1310.

In block 1312, the management server 1100 determines a control action to be taken based on the target temperature and the temperature data. The determination can be made using any suitable algorithm. For example, if a PID controller is used, the temperature data can be compared to the target temperature and provided as an input to the control function. If a bang-bang controller is used, the temperature data can be compared to a threshold temperature, and a parameter of the air flow of the vortex tube 104 can be changed based on whether the temperature data indicates a temperature that is past the threshold temperature. The control action to take may be any suitable control action. For example, the control action may be to change a parameter of the duct line valve 128 feeding into a compute device 102 to change the rate of the air flow delivered to that compute device, or the control action may be to change a parameter of the conical nozzle 206 to change the air flow rate and/or temperature at the cold output 108.

In block 1314, the management server 1100 may perform the control action determined in block 1312. For example, the compute device may change a parameter of the intake valve 124, the cold air output valve 126, the duct line valve 128, the conical nozzle 206, and/or the like. The method 1300 then loops back to block 1306 to acquire additional temperature data.

It should be appreciated that, in some embodiments, a relatively small amount of air flow from the vortex tubes 104 may significantly reduce the amount of air flow that system fans must provide. For example, in one test configuration, a tube was connected from a vortex tube and directed to a retimer card in a storage system such as an Intel® RAF1000JSP. With an input pressure of 6.9 bar at the vortex tube, the overall air flow from the fans of the storage system required to keep the system ambient temperature at 35° Celsius was reduced from 99 cubic feet per minute to 51 cubic feet per minute, with a corresponding drop in the power used by the fans from 202 watts to 98 watts, a reduction of 48% and 51% respectively.

EXAMPLES

Illustrative examples of the devices, systems, and methods disclosed herein are provided below. An embodiment of the devices, systems, and methods may include any one or more, and any combination of, the examples described below.

Example 1 includes a system for cooling a compute device, the system comprising a rack configured to receive a plurality of compute devices; one or more vortex tubes secured to the rack, each of the one or more vortex tubes comprising an intake, a cold output, and a hot output; and one or more tubes connected to the cold output of a vortex tube of the one or more vortex tubes.

Example 2 includes the subject matter of Example 1, and further including the plurality of compute devices, wherein each of the plurality of compute devices is disposed in the rack and comprise one or more components to be cooled, further comprising a plurality of tubes, each of the plurality of tubes configured to carry air from the cold output of a vortex tube of the one or more vortex tubes, wherein each of the plurality of tubes directs the air from the cold output of the corresponding vortex tube to the one or more components of a corresponding compute device of the plurality of compute devices.

Example 3 includes the subject matter of any of Examples 1 and 2, and further including a cable management arm for each of the plurality of compute devices, wherein at least a portion of each of the plurality of tubes is routed through the cable management arm of the corresponding compute device.

Example 4 includes the subject matter of any of Examples 1-3, and wherein the one or more components to be cooled of each of the plurality of compute devices comprise a plurality of memory modules, wherein each of the plurality of tubes direct air the corresponding plurality of memory modules.

Example 5 includes the subject matter of any of Examples 1-4, and further including a plurality of fans to provide air flow over components of each of the plurality of compute devices and one or more processors of each of the plurality of compute devices, wherein the plurality of memory modules of each of the plurality of compute devices is downstream in the air flow of the corresponding one or more processors.

Example 6 includes the subject matter of any of Examples 1-5, and wherein each of the plurality of compute devices comprises one or more processors, further comprising a liquid-cooling system comprising a heat sink for liquid cooling for each of the one or more processors of each of the plurality of compute devices.

Example 7 includes the subject matter of any of Examples 1-6, and wherein each of the plurality of compute devices does not have a fan to provide active air cooling.

Example 8 includes the subject matter of any of Examples 1-7, and wherein the plurality of memory modules of each of the plurality of compute devices comprises a plurality of dual in-line memory modules (DIMMs) with a pitch of less than 0.4 inches.

Example 9 includes the subject matter of any of Examples 1-8, and further including one or more temperature sensors associated with the one or more vortex tubes; one or more valves controlling air flow of the one or more vortex tubes; a management server comprising temperature data gatherer circuitry to acquire temperature data of the one or more temperature sensors; air flow controller circuitry to determine a target temperature of the one or more temperature sensors; determine, based on the target temperature and the temperature data of the one or more temperature sensors, a control action to take; and control the one or more valves controlling the air flow of the one or more vortex tubes based on the determined control action.

Example 10 includes the subject matter of any of Examples 1-9, and wherein the one or more temperature sensors associated with the one or more vortex tubes comprises a temperature sensor indicative of a temperature of air exiting a nozzle near the one or more components to be cooled, wherein to determine the target temperature of the one or more temperature sensors comprises to determine the target temperature of the one or more temperature sensors based on a dew point of an environment of the nozzle.

Example 11 includes the subject matter of any of Examples 1-10, and wherein the rack comprises a front side facing a cold aisle of a data center and a back side facing a hot aisle of the data center, wherein an air intake for each of the plurality of compute devices is from the cold aisle and an air exhaust for each of the plurality of compute devices is towards the hot aisle, wherein the hot output of each of the one or more vortex tubes is directed towards the hot aisle of the data center.

Example 12 includes the subject matter of any of Examples 1-11, and wherein each of the one or more vortex tubes is connected to a supply of compressed air, wherein a flow rate of the one or more vortex tubes is less than one standard cubic foot per minute.

Example 13 includes the subject matter of any of Examples 1-12, and wherein the one or more tubes are held in place by one or more clips and one or more spacers.

Example 14 includes a method for cooling a compute device, the method comprising supplying compressed air to an intake of each of one or more vortex tubes, each of the one or more vortex tubes comprising the intake, a cold output, and a hot output; and routing, with use of one or more tubes, air from the cold output of each of the one or more vortex tubes, to one or more components of the compute device to provide spot cooling.

Example 15 includes the subject matter of Example 14, and further including routing, with use of a plurality of tubes, air from the cold output of a vortex tube of the one or more vortex tubes to one or more components of each of a plurality of compute devices disposed in a rack of a data center.

Example 16 includes the subject matter of any of Examples 14 and 15, and wherein the rack comprises a front side facing a cold aisle of the data center and a back side facing a hot aisle of the data center, wherein an air intake for each of the plurality of compute devices is from the cold aisle and an air exhaust for each of the plurality of compute devices is towards the hot aisle, further comprising directing the hot output of each of the one or more vortex tubes towards the hot aisle of the data center.

Example 17 includes the subject matter of any of Examples 14-16, and wherein routing, with use of the one or more tubes, the air from the cold output of each of the one or more vortex tubes, to one or more components of the compute device comprise routing the air from the cold output of each of the one or more vortex tubes to a plurality of memory modules of the compute device.

Example 18 includes the subject matter of any of Examples 14-17, and wherein the compute device comprises a plurality of fans to provide air flow over components of the compute device and one or more processors in the compute device, wherein each of the plurality of memory modules is downstream in the air flow of the one or more processors.

Example 19 includes the subject matter of any of Examples 14-18, and wherein the compute device comprises one or more processors; and a liquid-cooling system comprising a heat sink for liquid cooling for each of the one or more processors.

Example 20 includes the subject matter of any of Examples 14-19, and further including acquiring, by a management server, temperature data of one or more temperature sensors associated with the one or more vortex tubes; determining, by the management server, a target temperature of the one or more temperature sensors; determining, by the management server and based on the target temperature and the temperature data of the one or more temperature sensors, a control action to take to control one or more valves controlling air flow of the one or more vortex tubes; and controlling, by the management server, the one or more valves controlling the air flow of the one or more vortex tubes based on the determined control action.

Example 21 includes the subject matter of any of Examples 14-20, and wherein the one or more temperature sensors associated with the one or more vortex tubes comprises a temperature sensor indicative of a temperature of air exiting a nozzle near the one or more components to be cooled, wherein determining the target temperature of the one or more temperature sensors comprises determining the target temperature of the one or more temperature sensors based on a dew point of an environment of the nozzle.

Example 22 includes the subject matter of any of Examples 14-21, and wherein supplying compressed air to the intake of each of the one or more vortex tubes comprises connecting the intake of each of the one or more vortex tubes to an air compressor that has been used in the data center for at least six months prior to being connected to any vortex tube.

Example 23 includes one or more computer-readable media comprising a plurality of instructions stored thereon that, when executed by a management server, causes the management server to acquire temperature data of one or more temperature sensors associated with one or more vortex tubes that have a cold output routed to one or more components of a compute device to provide spot cooling; determine a target temperature of the one or more temperature sensors; determine, based on the target temperature and the temperature data of the one or more temperature sensors, a control action to take to control one or more valves controlling air flow of the one or more vortex tubes; and control the one or more valves controlling the air flow of the one or more vortex tubes based on the determined control action.

Example 24 includes the subject matter of Example 23, and wherein the one or more temperature sensors associated with the one or more vortex tubes comprises a temperature sensor indicative of a temperature of air exiting a nozzle near the one or more components to be cooled, wherein to determine the target temperature of the one or more temperature sensors comprises to determine the target temperature of the one or more temperature sensors based on a dew point of an environment of the nozzle.

Example 25 includes the subject matter of any of Examples 23 and 24, and wherein the one or more valves comprise a pressure regulator, wherein to control the one or more valves comprises to control the pressure regulator.

The invention claimed is:

1. A system for cooling a plurality of compute devices, the system comprising:
   a rack configured to receive the plurality of compute devices;
   the plurality of compute devices, wherein each of the plurality of compute devices is disposed in the rack and comprises a plurality of dual in-line memory modules (DIMMs) with a pitch of less than 0.4 inches;
   vortex tubes secured to the rack, each of the vortex tubes comprising an intake, a cold output, and a hot output; and
   a plurality of tubes connected to the cold output of a vortex tube of the vortex tubes, wherein each of the plurality of tubes directs air to a corresponding plurality of dual in-line memory modules of a corresponding compute device of the plurality of compute devices.

2. The system of claim 1, further comprising a cable management arm for each of the plurality of compute devices, wherein at least a portion of each of the plurality of tubes is routed through the cable management arm of the corresponding compute device.

3. The system of claim 1, further comprising a plurality of fans to provide air flow over one or more processors of each of the plurality of compute devices, wherein the plurality of dual in-line memory modules of each of the plurality of compute devices is downstream in the air flow of a corresponding one or more processors.

4. The system of claim 1, wherein each of the plurality of compute devices comprises one or more processors, further comprising a liquid-cooling system comprising a heat sink for liquid cooling for each of the one or more processors of each of the plurality of compute devices.

5. The system of claim 4, wherein each of the plurality of compute devices does not have a fan to provide active air cooling.

6. The system of claim 1, further comprising:
one or more temperature sensors associated with the vortex tubes;
one or more valves controlling air flow of the vortex tubes;
a management server comprising:
temperature data gatherer circuitry to acquire temperature data of the one or more temperature sensors;
air flow controller circuitry to:
determine a desired temperature of the one or more temperature sensors;
determine, based on the desired temperature and the temperature data of the one or more temperature sensors, a control action to take; and
control the one or more valves controlling the air flow of the vortex tubes based on the determined control action.

7. The system of claim 6, wherein one of the one or more temperature sensors associated with the vortex tubes is indicative of a temperature of air exiting a nozzle near the plurality of dual in-line memory modules,
wherein to determine the desired temperature of the one or more temperature sensors comprises to determine the desired temperature of the one or more temperature sensors based on a dew point of an environment of the nozzle.

8. The system of claim 1, wherein the rack comprises a front side facing a cold aisle of a data center and a back side facing a hot aisle of the data center, wherein an air intake for each of the plurality of compute devices is from the cold aisle and an air exhaust for each of the plurality of compute devices is towards the hot aisle,
wherein the hot output of each of the vortex tubes is directed towards the hot aisle of the data center.

9. The system of claim 1, wherein each of the vortex tubes is connected to a supply of compressed air,
wherein a flow rate of the vortex tubes is less than one standard cubic foot per minute.

10. The system of claim 1, wherein the vortex tubes are held in place by one or more clips and one or more spacers.

11. A method comprising:
supplying compressed air to an intake of each of vortex tubes, each of the vortex tubes comprising the intake, a cold output, and a hot output, wherein each of the vortex tubes is secured to a rack configured to receive a plurality of compute devices; and
routing, with use of a plurality of tubes, air from the cold output of each of the vortex tubes to a plurality of dual in-line memory modules (DIMMs) with a pitch of less than 0.4 inches of each of the plurality of compute devices to provide spot cooling.

12. The method of claim 11, wherein the rack comprises a front side facing a cold aisle of a data center and a back side facing a hot aisle of the data center, wherein an air intake for each of the plurality of compute devices is from the cold aisle and an air exhaust for each of the plurality of compute devices is towards the hot aisle,
further comprising directing the hot output of each of the vortex tubes towards the hot aisle of the data center.

13. The method of claim 11, wherein each of the plurality of compute devices comprises a plurality of fans to provide air flow over components of a corresponding compute device and one or more processors in the corresponding compute device, wherein each of the plurality of memory modules of each of the plurality of compute devices is downstream in the air flow of the corresponding one or more processors.

14. The method of claim 11, wherein each of the plurality of compute devices comprises:
one or more processors; and
a liquid-cooling system comprising a heat sink for liquid cooling for each of the one or more processors.

15. The method of claim 11, further comprising:
acquiring, by a management server, temperature data of one or more temperature sensors associated with the vortex tubes;
determining, by the management server, a desired temperature of the one or more temperature sensors;
determining, by the management server and based on the desired temperature and the temperature data of the one or more temperature sensors, a control action to take to control one or more valves controlling air flow of the vortex tubes; and
controlling, by the management server, the one or more valves controlling the air flow of the vortex tubes based on the determined control action.

16. The method of claim 15, wherein the one or more temperature sensors associated with the vortex tubes comprises a temperature sensor indicative of a temperature of air exiting a nozzle near plurality of dual in-line memory modules,
wherein determining the desired temperature of the one or more temperature sensors comprises determining the desired temperature of the one or more temperature sensors based on a dew point of an environment of the nozzle.

17. The method of claim 11, wherein supplying compressed air to the intake of each of the vortex tubes comprises connecting the intake of each of the vortex tubes to an air compressor that has been used in a data center for at least six months prior to being connected to any vortex tube.

18. One or more non-transitory computer-readable media comprising a plurality of instructions stored thereon that, when executed by a management server, causes the management server to:
acquire temperature data of one or more temperature sensors associated with vortex tubes that have a cold output routed to a plurality of dual in-line memory modules (DIMMs) with a pitch of less than 0.4 inches of a compute device to provide spot cooling;
determine a desired temperature of the one or more temperature sensors;
determine, based on the desired temperature and the temperature data of the one or more temperature sensors, a control action to take to control one or more valves controlling air flow of the vortex tubes; and control the one or more valves controlling the air flow of the vortex tubes based on the determined control action.

19. The non-transitory computer-readable media of claim 18, wherein the one or more temperature sensors associated with the vortex tubes comprises a temperature sensor indicative of a temperature of air exiting a nozzle near the plurality of dual in-line memory modules (DIMMs), wherein to determine the desired temperature of the one or more temperature sensors comprises to determine the desired temperature of the one or more temperature sensors based on a dew point of an environment of the nozzle.

20. The non-transitory computer-readable media of claim 18, wherein the one or more valves comprise a pressure regulator, wherein the plurality of instructions further causes the management server to control the pressure regulator.

* * * * *